US012669542B2

(12) United States Patent
Huang

(10) Patent No.: US 12,669,542 B2
(45) Date of Patent: Jun. 30, 2026

(54) ELECTRICAL ENERGY GENERATOR AND AUTOMATIC MEASUREMENT CIRCUIT THEREOF

(71) Applicant: Siemens Healthineers AG, Forchheim (DE)

(72) Inventor: Yong Huang, Shanghai (CN)

(73) Assignee: Siemens Healthineers AG, Forchheim (DE)

( * ) Notice: Subject to any disclaimer, the term of this patent is extended or adjusted under 35 U.S.C. 154(b) by 167 days.

(21) Appl. No.: 18/400,017

(22) Filed: Dec. 29, 2023

(65) Prior Publication Data

US 2024/0219468 A1    Jul. 4, 2024

(30) Foreign Application Priority Data

Dec. 30, 2022    (CN) .......................... 202211742887.2

(51) Int. Cl.
*H02J 3/12*        (2026.01)
*G01R 31/34*       (2020.01)
*H05G 1/26*        (2006.01)

(52) U.S. Cl.
CPC .............. *G01R 31/343* (2013.01); *H02J 3/12* (2013.01); *H05G 1/265* (2013.01)

(58) Field of Classification Search
CPC ..................................................... G01R 31/343
See application file for complete search history.

(56) References Cited

U.S. PATENT DOCUMENTS

| | | | |
|---|---|---|---|
| 2,222,536 A | 11/1940 | Alfred et al. | |
| 5,241,260 A | 8/1993 | Beland | |
| 2022/0258593 A1* | 8/2022 | Kadota | ................... B60K 6/46 |

FOREIGN PATENT DOCUMENTS

| | | | | |
|---|---|---|---|---|
| CN | 102170540 A | 8/2011 | | |
| CN | 104167720 A | 11/2014 | | |
| CN | 105259420 A | 1/2016 | | |
| CN | 207601246 | * | 7/2018 | ............. G01R 31/28 |
| CN | 207601246 U | 7/2018 | | |
| CN | 214953999 U | 11/2021 | | |
| CN | 115166569 | * | 10/2022 | ............. G01R 31/40 |
| CN | 115166569 A | 10/2022 | | |

* cited by examiner

*Primary Examiner* — Alesa Allgood
(74) *Attorney, Agent, or Firm* — Banner & Witcoff, Ltd.

(57)        ABSTRACT
An automatic measurement circuit of an electrical energy generator, where the electrical energy generator having an input end connected to a power grid, and an output end connected to an electrical component, may include a discharge loop, having a switch and a discharge resistor connected in series, the discharge resistor discharging electrical energy generated by the electrical energy generator; a control circuit, which controls opening and closing of the switch; where, before the electrical energy generator supplies power to the electrical component, the control circuit controls the switch to close for a first duration, to perform discharging through the discharge resistor. The electrical energy generator and an automatic measurement circuit may measure the electrical energy output status of the electrical energy generator.

8 Claims, 11 Drawing Sheets

ELECTRICAL ENERGY GENERATOR AND AUTOMATIC MEASUREMENT CIRCUIT THEREOF

CROSS REFERENCE TO RELATED APPLICATIONS

This patent application claims priority to Chinese Patent Application No. 202211742887.2, filed Dec. 30, 2022, which is incorporated herein by reference in its entirety.

BACKGROUND

Technical Field

The present disclosure relates to the field of circuits, in particular to an electrical energy generator and a measurement circuit thereof.

Background Art

High-power electrical energy generators are widely used in modern society, and their ability to supply power often needs to be ascertained. In addition, when such an electrical energy generator is connected to a power grid for use, it might also be affected by the power grid's ability to supply power. At this time, the question of whether the electrical energy which it can supply meets actual requirements is also one which has focused attention in the art.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
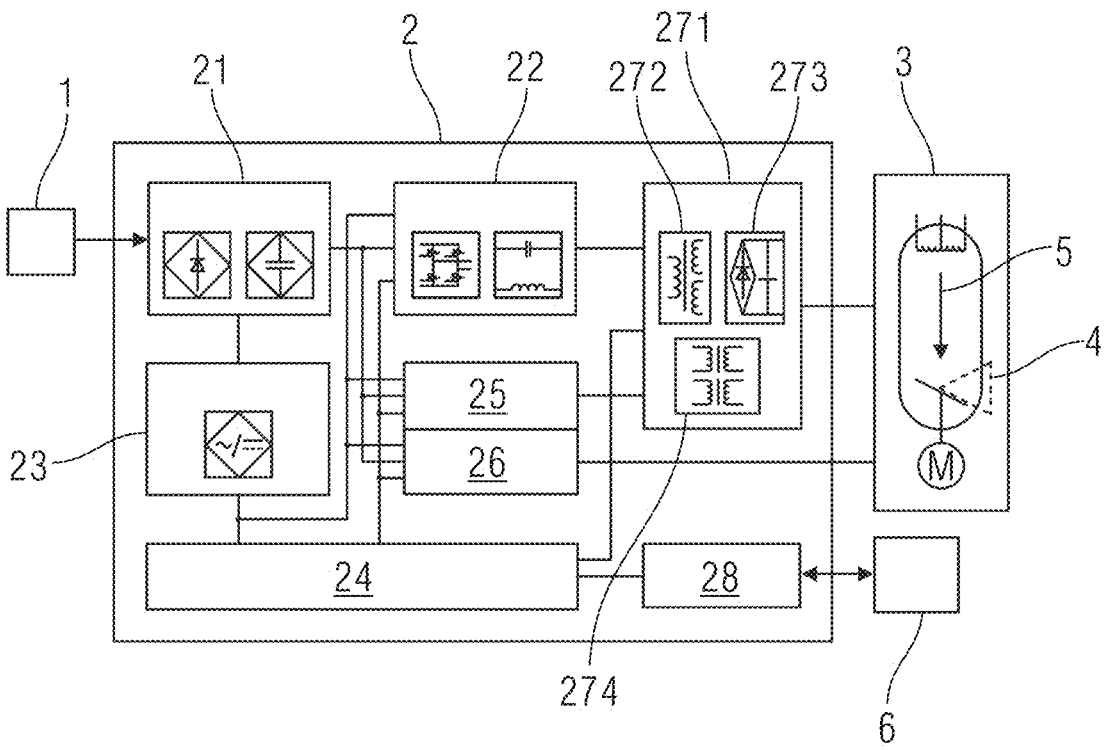
FIG. 1 shows the composition of an exemplary X-ray generator of the present disclosure and the circuit structure of a high-frequency high voltage generator.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

In view of the above, the present disclosure provides an electrical energy generator and a detection circuit thereof.

According to an exemplary embodiment of the present disclosure, an automatic measurement circuit of an electrical energy generator, the electrical energy generator having an input end connected to a power grid, and an output end connected to an electrical component, wherein the automatic measurement circuit comprises: a discharge loop, having a switch and a discharge resistor connected in series, the discharge resistor discharging electrical energy generated by the electrical energy generator; and a control circuit, which controls opening and closing of the switch; wherein, before the electrical energy generator supplies power to the electrical component, the control circuit controls the switch to close for a first duration, to perform discharging through the discharge resistor.

According to an exemplary embodiment of the present disclosure, after the electrical energy generator has supplied power to the electrical component, the control circuit controls the switch to close for a second duration, to perform discharging through the discharge resistor.

According to an exemplary embodiment of the present disclosure, the power grid is AC, the electrical energy generator further comprises a rectifying and filtering circuit for rectifying and filtering AC power of the power grid, and the automatic measurement circuit further comprises: a bus voltage measurement circuit, for acquiring a bus voltage value outputted by the rectifying and filtering circuit; and a discharge current measurement circuit, for acquiring a discharge resistor current value of a discharge process of the first duration; the first duration being greater than or equal to one period of a rectified waveform.

According to an exemplary embodiment of the present disclosure, the discharge current measurement circuit is realized by measuring a voltage across the discharge resistor.

According to an exemplary embodiment of the present disclosure, an electrical energy generator, having an input end connected to AC power of a power grid, and an output end connected to an electrical component, wherein the electrical energy generator comprises: a rectifying and filtering circuit, for rectifying and filtering AC power of the power grid; and the automatic measurement circuit as described in any one of the embodiments above.

According to an exemplary embodiment of the present disclosure, an electrical energy generator, having an input end connected to AC power of a power grid, and an output end connected to an electrical component, wherein the electrical energy generator comprises: a rectifying and filtering circuit, for rectifying and filtering AC power of the power grid; the abovementioned automatic measurement circuit comprising the bus voltage measurement circuit and the discharge current measurement circuit; a calculating unit, for calculating an internal resistance of the power grid on the basis of the bus voltage and the voltage across the discharge resistor.

According to an exemplary embodiment of the present disclosure, before power is supplied to the electrical component, the control circuit controls the switch of the discharge loop to open, and the calculating unit reads a first voltage of the bus; then the control circuit controls the switch of the discharge loop to close, and the calculating unit reads a second voltage of the bus and a third voltage across the discharge resistor, and calculates the internal resistance of the power grid at least on the basis of the first voltage, the second voltage, the third voltage, and the resistance of the discharge resistor.

According to an exemplary embodiment of the present disclosure, the calculating unit further calculates a maximum electrical power of the electrical component on the basis of the internal resistance of the power grid.

According to an exemplary embodiment of the present disclosure, the calculation of a maximum electrical power of the electrical component comprises: using a power supply lower deviation tolerance value and the internal resistance of the power grid to calculate a maximum output current; using the maximum output current and a nominal supply voltage of the electrical component to calculate a maximum electrical power of the electrical component.

According to an exemplary embodiment of the present disclosure, the electrical component is an X-ray tube assembly, and the electrical energy generator further comprises: a filament heating circuit.

The electrical energy generator and automatic measurement circuit thereof provided in accordance with the present disclosure can measure the output status of the electrical energy generator.

To make the objectives, technical solutions and advantages of the present disclosure clearer, the present disclosure will be further described in detail below by way of embodiments. It should be understood that the detailed description of the disclosure described here is only used to illustrate and explain the present disclosure, and is not intended to limit the present disclosure.

In an exemplary embodiment, an automatic measurement circuit of an electrical energy generator is provided. The electrical energy generator has an input end connected to a power grid, and an output end connected to an electrical component, and the automatic measurement circuit comprises: a discharge loop, having a switch and a discharge resistor connected in series, the discharge resistor discharging electrical energy generated by the electrical energy generator; and a control circuit, which controls opening and closing of the switch, wherein, before the electrical energy generator supplies power to the electrical component, i.e. before the electrical energy generator is required to supply electricity at high power to the electrical component, the control circuit controls the switch to close for a first duration, to perform discharging through the discharge resistor. The key approach lies in the fact that before the electrical energy generator supplies power to the electrical component, the discharge resistor of the automatic measurement circuit is used to discharge the electrical energy generator once. This discharge process can simulate the process of electricity consumption by the electrical component, and it is thus possible to observe the power supply status of the electrical energy generator by means of the discharge process, to achieve the objective of automatic measurement. More specifically, since discharge takes place through the resistor, and indices such as voltage and current of the resistor can be easily measured or calculated, the power supply status of the electrical energy generator can be obtained by means of these indices. This resistor may be a single resistor or multiple resistors, and may be a variable resistor, so as to simulate the electricity consumption processes of various electrical components, and obtain the power supply ability of the electrical energy generator in various situations.

In an exemplary embodiment, after the electrical energy generator has supplied power to the electrical component, the control circuit controls the switch to close for a second duration, to perform discharging through the discharge resistor. The discharge resistor has two functions. Firstly, before power is supplied to the electrical component, when the electrical component might be in a standby process following switch-on, the discharge resistor is used to simulate an electricity consumption process of the electrical component, so as to measure the power supply status of the electrical energy generator. Another function is to release surplus electrical energy from the electrical energy generator for the second duration after power has been supplied to the electrical component, i.e. when the electrical component does not require a power supply, to maintain electrical safety.

In an exemplary embodiment, the power grid is AC, the electrical energy generator further comprises a rectifying and filtering circuit for rectifying and filtering AC power of the power grid, and the automatic measurement circuit further comprises: a bus voltage measurement circuit, for acquiring a bus voltage value outputted by the rectifying and filtering circuit; and a discharge current measurement circuit, for acquiring a discharge resistor current value of a discharge process of the first duration, the first duration being greater than or equal to one period of a rectified waveform. In this embodiment, the indices of the bus voltage value and the discharge resistor current value are measured, and may be used for subsequent measurement of power supply status. Examples are measuring whether the bus voltage drops during discharging, and measuring whether electrical capacity during discharge meets expectations, wherein this electrical capacity can be reflected by the current value of the discharge resistor, so as to assess the ability to supply power. Here, it is necessary for the first duration to be greater than one period of the rectified waveform, so that complete power supply information can be acquired, rather than acquiring the status in only part of the whole period due to a short duration.

In an exemplary embodiment, the discharge current measurement circuit is realized by measuring the voltage across the discharge resistor. The discharge current of the discharge resistor can be easily calculated by means of the resistance of the discharge resistor and the subsequently acquired voltage across the discharge resistor, so as to acquire the power supply ability. The purpose of measuring the discharge current is to measure indices related to electrical capacity. To assess electrical capacity, the electrical capacity itself is not necessarily calculated directly; for example, if only the current of the discharge resistor is acquired, this also describes electrical capacity, so only acquiring the current of the discharge resistor falls within the concept of electrical capacity measurement. Other indices are similar; any index capable of describing electrical capacity can be used to describe electrical capacity.

In an exemplary embodiment, an electrical energy generator is disclosed. The electrical energy generator has an input end connected to AC power of a power grid, and an output end connected to an electrical component, and the electrical energy generator comprises: a rectifying and filtering circuit, for rectifying and filtering AC power of the power grid; and any one of the automatic measurement circuits described above. In this embodiment, the electrical energy generator rectifies and filters the AC power of the power grid, and comprises an automatic measurement circuit, which can subject a rectified and filtered output to discharge processing, so as to measure the power supply ability of the electrical energy generator.

In an exemplary embodiment, an electrical energy generator is disclosed. The electrical energy generator has an input end connected to AC power of a power grid, and an output end connected to an electrical component, and the electrical energy generator comprises: a rectifying and filtering circuit, for rectifying and filtering AC power of the power grid; the abovementioned automatic measurement circuit comprising the bus voltage measurement circuit and the discharge current measurement circuit; and a calculating unit, for calculating an internal resistance of the power grid on the basis of the bus voltage and the voltage across the discharge resistor. The internal resistance of the power grid will divide the voltage, especially in the case of high current, so the internal resistance of the power supply often needs to be known in advance. In this embodiment, the internal resistance of the power grid is calculated from the bus voltage and the voltage across the discharge resistor. Specifically, before power is supplied to the electrical component, the control circuit may control the switch of the discharge loop to open, and the calculating unit reads a first voltage of the bus; then the control circuit controls the switch of the discharge loop to close, and the calculating unit reads a second voltage of the bus and a third voltage across the discharge resistor, and calculates the internal resistance of the power grid at least on the basis of the first voltage, the second voltage, the third voltage, and the resistance of the discharge resistor. More specifically, the voltage drop of the bus in the discharge process may be acquired on the basis of the difference between the first voltage and the second voltage; this voltage drop is the divided voltage of the internal resistance of the power grid. The discharge current can then be calculated on the basis of the third voltage and the resistance of the discharge resistor. The quotient of the divided voltage of the internal resistance and the discharge current gives the value of the internal resistance.

In an exemplary embodiment, the calculating unit also calculates a maximum electrical power of the electrical component on the basis of the internal resistance of the power grid. After calculating the internal resistance, it is often also necessary to estimate the maximum power that the electrical component can use, in order for an operator to ascertain in advance how high a power the electrical component can operate at. Specifically, the calculation of the maximum electrical power of the electrical component comprises: using a power grid supply voltage value at the present time, a lower deviation tolerance value of a nominal power supply of the electrical component, and the internal resistance of the power grid, a maximum output current can be calculated; then the maximum output current, the power grid supply voltage at the present time, and the lower deviation tolerance voltage value of the nominal power supply of the electrical component, are used to calculate the maximum electrical power of the electrical component. First, the difference between the power grid supply voltage at the present time and the lower deviation tolerance voltage value of the nominal power supply of the electrical component is divided by the internal resistance of the power grid, to acquire the maximum output current value for this power grid internal resistance. Finally, by multiplying this maximum output current by the highest average voltage of the electrical component that can be attained, the maximum electrical power of the electrical component can be obtained. The process of calculation above is merely exemplary. Various coefficients may be added according to actual circumstances, e.g. coefficients added for single-phase electricity or three-phase electricity, or coefficients added for errors. All of these may be selected according to convenience and accuracy calculated from an engineering perspective.

In an exemplary embodiment, the electrical component is an X-ray tube assembly, and the electrical energy generator further comprises: a filament heating circuit. This solution is particularly advantageous the scenario of supplying power to an X-ray tube assembly; the maximum power attainable in the next exposure of the X-ray tube assembly can be obtained, avoiding invalid exposures.

In an exemplary embodiment, the case where a high-frequency high voltage generator of the X-ray tube assembly acts as an electrical energy generator is used as a particular application scenario, to explain in detail an exemplary embodiment of the present disclosure. X-ray generators are widely used in the field of medical imaging. An X-ray generator consists of an X-ray tube assembly and a high voltage generator for controlling the X-ray tube assembly. The output power supply quality of the high voltage generator acting as the power supply of the X-ray generator also affects the final imaging quality, so the issue of how to acquire the power supply quality has become a focus of interest in the art. In particular, referring to FIG. 1, an X-ray generator consists of two main components, specifically a high-frequency high voltage generator 2 as an electrical energy generator and an X-ray tube assembly 3 as an electrical component. The function of the X-ray tube assembly 3 is to produce electrons 5, and cause the electrons 5 to bombard an anode to produce an X-ray 4. In the case of a rotating-anode X-ray tube assembly, it is also necessary to drive rotation of the anode by an anode-rotating motor M. The X-ray tube assembly 5 requires a voltage of at least tens of kilovolts, such as a voltage of 40 kV to 150 kV. This requires the high-frequency high voltage generator 2 to provide a high voltage which is mainly applied between the anode and a cathode, to impart speed to the electrons 5. In addition to the high voltage, the filament also requires a power supply. This also needs to be supplied by the high-frequency high voltage generator 2 at the same time. Therefore, the high-frequency high voltage generator 2 provides multiple power supplies.

Conventional voltage generators widely employ high-frequency inversion to generate a DC high voltage for supplying power to the X-ray tube assembly, and are therefore called high-frequency high voltage generators 2. In particular, referring to FIG. 1, the high-frequency high voltage generator 2 comprises a rectifying and filtering circuit 21 downstream of an input from a three-phase/single-phase grid power supply 1, a high voltage main inversion circuit 22, a high voltage oil tank 271 (containing a high voltage transformer 272, a large/small focal spot filament transformer 274, a high voltage rectifying and filtering circuit 273, etc.), a filament heating circuit 25, a rotating-anode drive circuit 26 (in the case of a rotating-anode X-ray tube assembly), a generator control circuit 24, a low voltage control power supply 23 and a peripheral interface circuit 28, etc. Once the three-phase/single-phase grid power supply 1 of the power grid is introduced to the high-frequency high voltage generator 2, a variety of power supplies required by the X-ray generator will be generated. The high voltage transformer 272 and the high voltage rectification filter 273 in the high voltage oil tank 271 are responsible for applying a high voltage between the cathode and anode of the X-ray tube assembly, while the large/small focal spot filament transformer 274 is responsible for supplying power to the filament in the cathode. The filament heating circuit 25 is responsible for supplying power to the filament, and the rotating-anode drive circuit 26 is responsible for driving the motor M of the anode target disk. The generator control circuit 24 is responsible for the control of the entire generator, such as the regulation of high voltage, the regulation of the filament power supply and the regulation of anode rotation drive; the low voltage control power supply 23 is responsible for the supply of low voltage power to internal circuitry or components in the high-frequency high voltage generator 2; and the electrical energy outputted by the rectifying and filtering circuit 21 is responsible for supplying high power electricity to the high voltage main inversion circuit 22, the filament heating circuit 25 and the rotating-anode drive circuit 26. The peripheral interface circuit 28 is connected to a peripheral component 6, such as an external door switch, temperature switch, communication interface, bed interface, etc.

Figure 2:
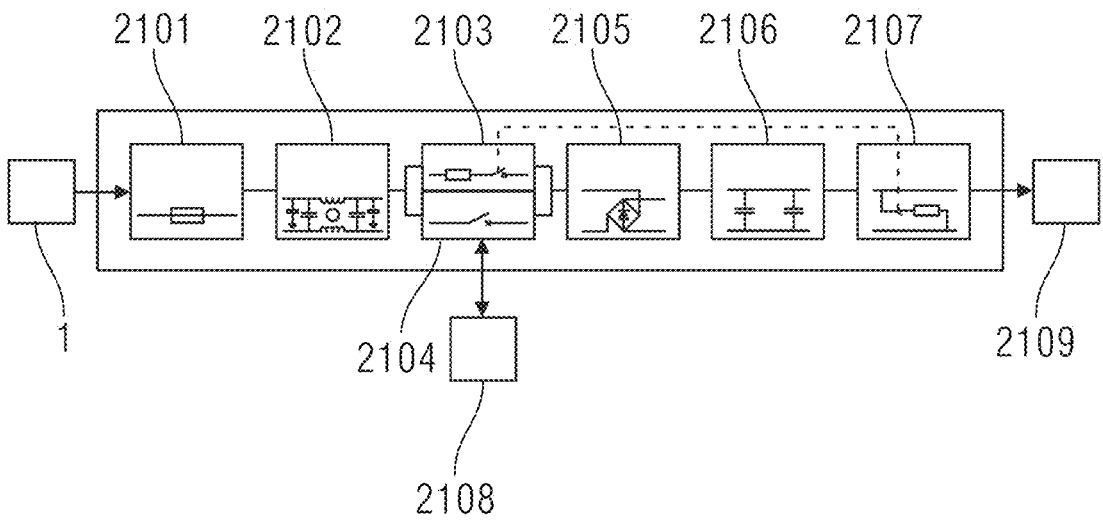
FIG. 2 shows post-input processing of a power supply of a high-frequency high voltage generator in an exemplary embodiment of the present disclosure.

In an exemplary embodiment, referring to FIG. 2 in particular, an implementation of the rectifying and filtering circuit 21 in FIG. 1 is shown, an important function thereof being to convert AC to DC. The circuit structure of the rectifying and filtering circuit 21 therein may employ the following manner of processing. (1) There is an overload protection module 2101; a circuit breaker or fuse is often used. (2) There is an EMC power supply filter 2102, to eliminate interference from the input power supply and EMC interference to the input power supply. (3) There are two contactors: a current-limiting contactor 2103 and a switch-on contactor 2104. Generally, at switch-on, a very large surge current will arise at the moment when charging of a large-capacity filtering capacitor begins, so in order to limit this current, it is necessary to first close the current-limiting contactor 2103; that is to say, a certain resistance is series-connected in an operating loop of this contactor, thereby limiting a charging current to the filtering capacitor, and preventing an instantaneous short circuit as the capacitor begins to charge. After a certain charging delay (generally after a few seconds, when the voltage across the filtering capacitor has risen to about 90% of the maximum voltage), the switch-on contactor 2104 is closed. Thus, a control 2108 for the current-limiting contactor and the switch-on contactor is needed, in order to control the timing of on/off switching of the two contactors. It will be readily understood that the control 2108 for the current-limiting contactor and the switch-on contactor may be provided by the generator control circuit 24, or by another component with a control function. (4) There is a full-wave rectification circuit module 2105, used to convert AC power to DC power. (5) There is a filtering circuit module 2106, generally using capacitive filtering, the size of the capacitance being determined by the output power of the generator. The main purpose is to smooth the DC power. (6) There is a discharge loop 2107. After switch-off, in order to prevent a high voltage of several hundred volts on the capacitor from causing a risk to safety, the electrical energy on the capacitor needs to be released via a discharge loop to below a safe voltage for the human body. Often, a switch with normally-closed contacts is used in series connection with a resistor to release the electrical energy, and the discharge loop automatically opens at switch-on. The rectifying and filtering circuit 21 will eventually output a DC bus voltage output 2109, and the DC bus voltage output 2109 can supply power to the high voltage main inversion circuit 22.

The embodiment shown in FIG. 2 has the following problems. Problem 1: the power supply internal resistance cannot be ascertained. For high voltage generators of different output powers, the International Electrotechnical Commission (IEC) has clearly stipulated requirements for the power supply internal resistance of power distribution grids; if the grid power supply has too large an internal resistance, the high-power output will be inadequate. In general, before installing machinery, the equipment manufacturer will require the customer to provide site power distribution meeting the installation requirements as required. However, in the course of operation of equipment, the condition of the power grid thereof will generally not be checked again. If changes occur to the internal resistance of the grid power supply, e.g. aging of distribution lines or aging of power distribution air switch contacts, etc. this may cause the internal resistance of the power grid supply to increase. If high-power exposure is used at this time, this will lead to the generator reporting an error, and produce an invalid exposure. Problem 2: in the case of less developed regions or regions relatively deficient in energy resources, it will often happen that the output voltage of the power distribution grid is too low, and even exceeds the −10% lower deviation; this will result in the generator being unable to operate normally. In the case of emergency patients, if a situation like problem 1 is encountered, it can be resolved by manually lowering the exposure power; in the case of problem 2, however, the embodiment shown in FIG. 2 has no effective method of performing an exposure operation on the emergency patient. One solution is as follows. For problem 2 above, in some generators, the grid supply voltage and/or bus voltage will be checked in real time to determine the state of the power grid supply; if the power grid voltage drops, exceeding the stipulated −10% error, the generator immediately generates error report information, and indicates that the generator is unable to operate normally.

Figure 3:
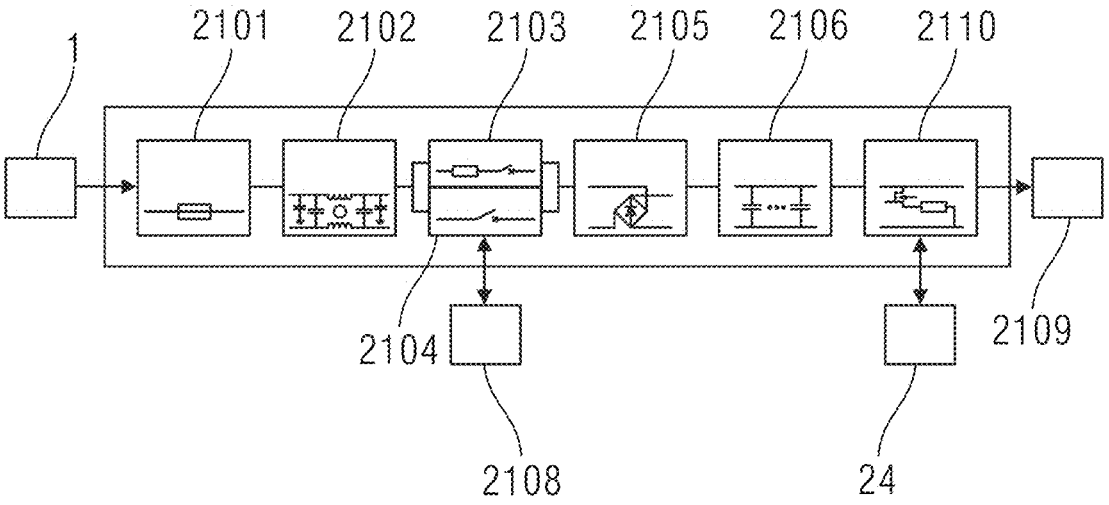
FIG. 3 shows a power supply input circuit of a high-frequency high voltage generator having the function of measuring power grid electrical energy capacity in an exemplary embodiment of the present disclosure.

In an exemplary embodiment, an automatic measurement circuit for power supply electrical energy is provided, and maximum exposure output power or energy of the generator can be determined from the measurement result; thus, in the condition of problem 1 or problem 2, successful completion of the next exposure can also be ensured. In particular, referring to FIG. 3, in comparison with the embodiment shown in FIG. 2, the discharge loop 2107 is replaced with a power grid electrical energy capacity measurement and discharge module 2110. The power grid electrical energy capacity measurement and discharge module 2110 not only has a discharging function, but also has the function of measuring the ability of the power grid to supply power. FIG. 3 below. In this embodiment, the internal resistance of the three-phase/single-phase grid power supply 1 may be measured, so as to estimate the maximum exposure output power of the X-ray tube assembly, thus avoiding exposure failures due to the effect of the internal resistance of the three-phase/single-phase grid power supply 1. The embodiment shown in FIG. 3 replaces the discharge loop 2107 in the embodiment shown in FIG. 2 with the power grid electrical energy capacity measurement and discharge module 2110, using a high-power switch to control the on/off switching of the discharge loop; this switch is controllable, being controlled by means of the generator control circuit 24 for example.

Figure 4:
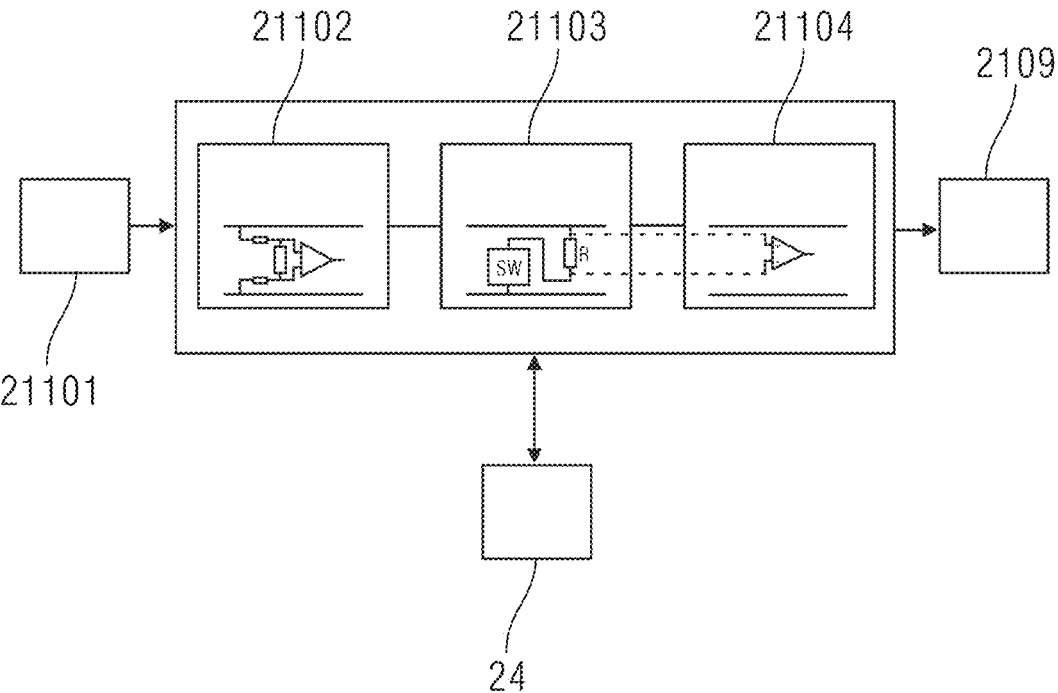
FIG. 4 is a block diagram of a power grid electrical energy measurement function in an exemplary embodiment of the present disclosure.

In an exemplary embodiment, referring to FIG. 4 in particular, an exemplary implementation of the power grid electrical energy capacity measurement and discharge circuit 2110 is shown. The power grid electrical energy capacity measurement and discharge circuit 2110 comprises the following constituent parts:

(1) Bus voltage measurement circuit 21102: it is necessary to measure the bus voltage value, i.e. the bus voltage value during standby, denoted $V_{UDC}$.

(2) Controlled discharge loop 21103: the previously mentioned discharge loop was controlled by means of the normally-closed contacts of the current-limiting contactor 2103, but the controlled discharge loop 21103 here needs to be actively controlled by the generator control circuit 24 for example. That is, a controlled discharge switch SW is a normally-closed switch, and after switch-off, charge on the filtering capacitor is released to a resistor R through this normally-closed switch. At start-up, before the current-limiting contactor 2103 operates, the controlled discharge switch SW must be opened, to make the discharge loop 21103 stop operating. The generator control circuit 24 triggers the switching of the high-power controlled discharge switch SW on and off, to trigger the discharge process.

(3) Discharge current measurement circuit 21104: when measuring the discharge current, it is first of all necessary to perform a measurement of instantaneous discharge current; current measurement is realized here by measuring the voltage across the discharge resistor R, denoted $V_R$.

Figure 5:
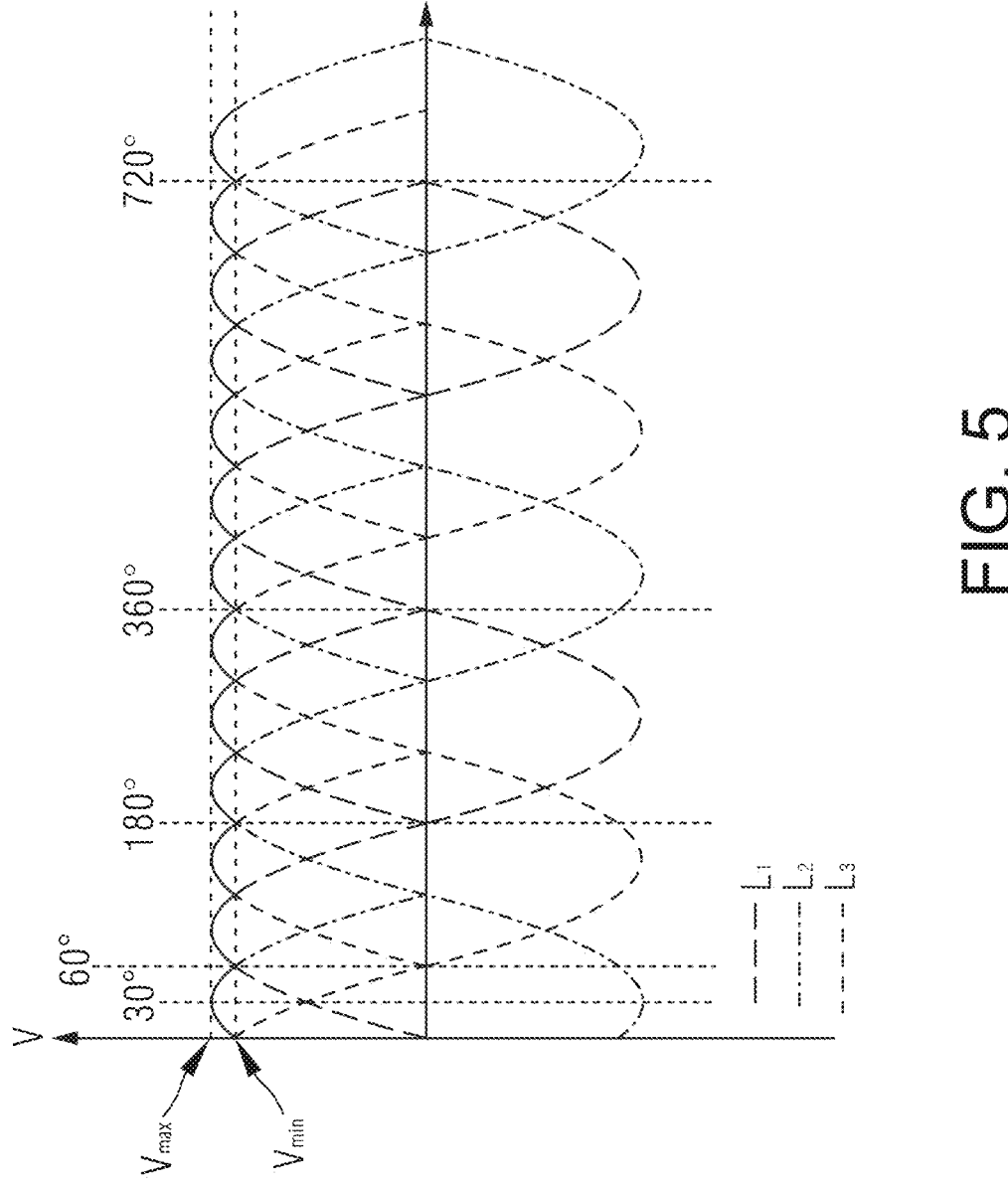
FIG. 5 is a schematic figure of three-phase full-wave rectification in an exemplary embodiment of the present disclosure.

(4) Calculation of electrical capacity: the calculation of electrical capacity is explained below, taking a three-phase input power supply as an example; FIG. 5 shows a schematic figure of three-phase rectification and filtering, in which L1, L2 and L3 respectively represent three phases of electricity, and the solid line represents a schematic figure after rectification to DC, wherein the wave peaks are labelled $V_{max}$, and the wave troughs are labelled $V_{min}$.

After switch-on, during standby, we can measure the rectified and filtered voltage of the three-phase power supply as $V_{UDC}$ by step (1) above; this $V_{UDC}$ is the voltage value after filtering, i.e. $V_{max}$ in FIG. 5; and the line voltage $V_{L-L}=V_{UDC}/\sqrt{2}$ of the three-phase power supply can be calculated therefrom, i.e. the voltage of the power grid can be obtained by measuring $V_{UDC}$.

Figure 6:
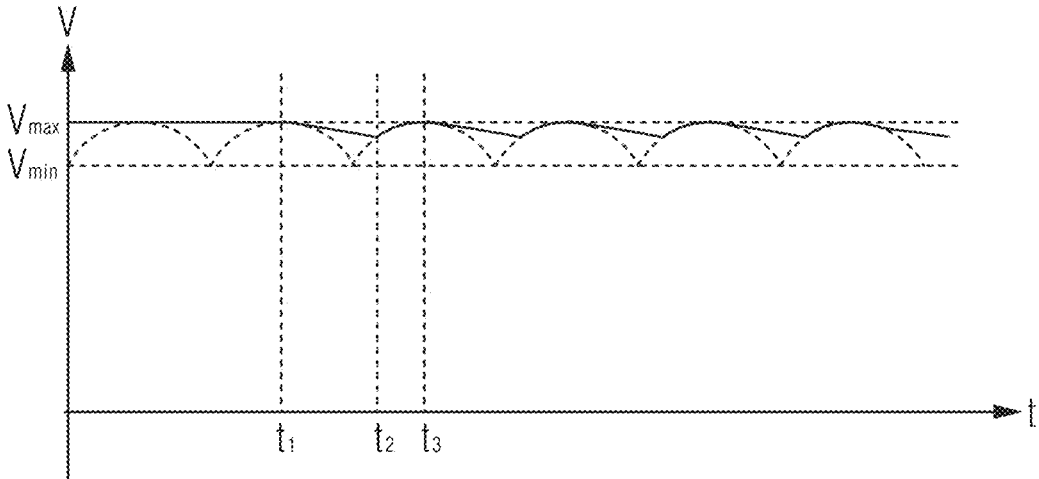
FIG. 6 shows a bus voltage waveform when output power is low in an exemplary embodiment of the present disclosure.

When the exposure power is low, the waveform of $V_{UDC}$ is as shown in FIG. 6. Suppose that exposure output is begun at time $t_1$; then within the time range $t_1 \leq t \leq t_2$, the voltage across the filtering capacitor falls according to the following exponential rule:

$$V_{UDC}(t) = V_{UDC} \cdot e^{-t/\tau}; (t_1 \leq t \leq t_2) \hspace{2cm} \text{Formula 1}$$

Here, C is the total capacity of the filtering capacitor; r is a time constant, and $\tau=R_L*C$, wherein:

$$R_L = V_{UDC}/I_L$$

$I_L$ being the current outputted by the bus voltage during exposure.

Precisely at time $t_2$, the grid supply voltage rises to the voltage across the filtering capacitor, at which time the grid power supply not only supplies energy to the exposure load, but also charges the filtering capacitor:

$$V_{UDC}(t) = V_{UDC} \cdot \sin(2\pi f(t - t_1)); (t_2 \leq t \leq t_3) \hspace{1cm} \text{Formula 2}$$

At time $t_3$, the voltage across the filtering capacitor again rises to $V_{UDC}$; subsequently, due to the drop in grid supply voltage, the voltage across the filtering capacitor again begins supplying electrical energy to the exposure load according to Formula 1.

Figure 7:
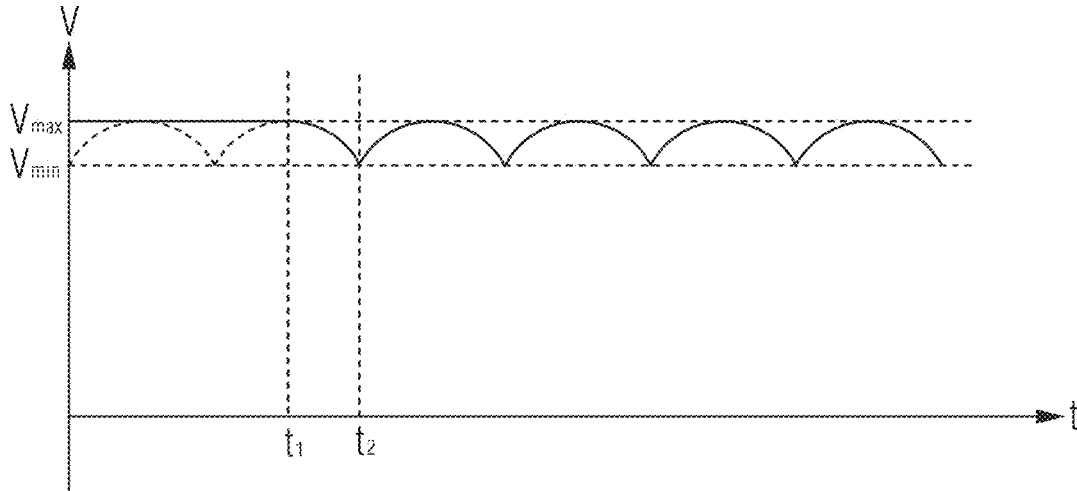
FIG. 7 shows a bus voltage waveform when output power is high in an exemplary embodiment of the present disclosure.

In particular, referring to FIG. 7, when the exposure power is high, i.e. when the current $I_L$ outputted by the bus voltage during exposure is very large, $R_L$ is very small, and the time constant t at this time is also very small, i.e. the energy stored in the filtering capacitor is not enough to supply the energy for exposure, which must be supplied by the grid power supply. In this case, the waveform of the bus voltage during exposure is as shown in FIG. 7. When exposure begins, the waveforms of the bus voltage and the grid power supply are the same, all of the input current is supplied to the output, and the storage of energy in the capacitor is difficult to achieve.

Figure 8:
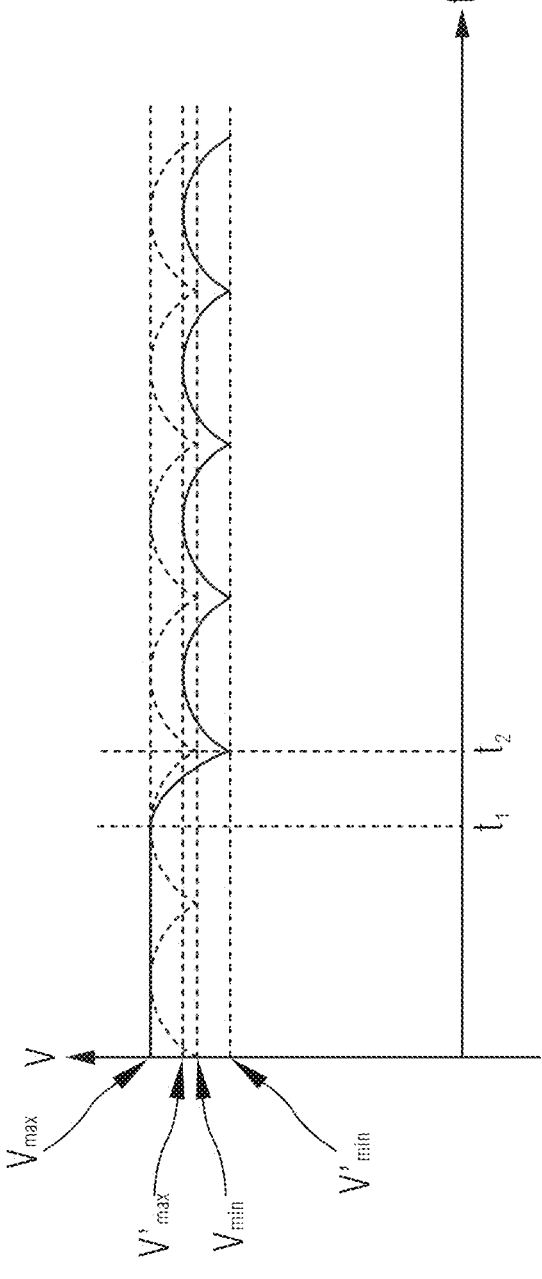
FIG. 8 shows a bus voltage waveform when output power is high and power grid supply internal resistance is considered in an exemplary embodiment of the present disclosure.

In the situations shown in FIGS. 6 and 7 and the analysis thereof, the internal resistance of the grid power supply is neglected; we can neglect it at low power outputs, but cannot neglect it at high power outputs, when the grid supply voltage will fall due to the effect of internal resistance, as shown in FIG. 8. Beginning at $t_1$, the internal resistance of the grid power supply begins to divide voltage, causing a drop in bus voltage.

At this time, if the bus voltage is measured during exposure, the measured voltage peak is $V'_{max}$; there is a voltage difference between this and $V_{max}$ in the standby state, i.e.

$$\Delta V = V_{max} - V'_{max} \hspace{2cm} \text{Formula 3}$$

This voltage drop $\Delta V$ is the voltage drop caused by the internal resistance of the grid power supply. If the current $I_L$ consumed during exposure can be obtained, then the internal resistance of the grid power supply can be calculated.

Of course, we need to obtain the value of the internal resistance of the grid power supply before exposure, and can thereby judge in advance whether the next exposure will exceed the capacity of the power grid. This embodiment utilizes the controlled discharge loop 21103. It must be explained that in order to simulate high-power exposure, the resistor R in the discharge loop 21103 must be set small, e.g. 10 ohms or even 1 ohm. Such values are merely illustrative; those skilled in the art can make a selection according to actual circumstances, as long as a high-power exposure of the X-ray tube assembly 3 can be simulated. If the discharge loop is controlled within a short time, this must be at least greater than one period of the rectified waveform; large-current discharge is performed, and the size of the discharge current is measured:

$$I_R = V_R/R$$

At the same time, the bus voltage is sampled during discharge, and the peak voltage within the measurement time is taken, i.e. $V'_{max}$; the internal resistance $r_i$ of the grid power supply can thereby be calculated:

$$r_i = (V_{UDC} - V'_{max}) \cdot R/V_R \qquad \text{Formula 4}$$

The maximum output current $i_{max}$ for this grid power supply internal resistance $r_i$ can thereby be calculated:

$$i_{max} = \left(V_{max} - 90\% \cdot \sqrt{2} \cdot V_{nominal}\right)/r_i \qquad \text{Formula 5}$$

Here, $V_{nominal}$ is the nominal supply voltage of the generator, and 10% is the lower deviation tolerance value of the power supply; if the equipment specifies 15%, then 15% is used. It must be explained that the lower deviation tolerance value is the tolerable error, i.e. if the lower deviation tolerance value is 10%, then exposure can also be performed using 90% of the voltage.

At this time, the maximum power that the equipment can output is:

$$p_{max} = \frac{1}{2} \cdot \left(V_{max} + 90\% \cdot \sqrt{2} \cdot V_{nominal}\right) \cdot i_{max} \qquad \text{Formula 6}$$

Here, $$\frac{1}{2} \cdot \left(V_{max} + 90\% \cdot \sqrt{2} \cdot V_{nominal}\right)$$

is the maximum average voltage value which can be outputted during exposure. This value can also be adjusted according to actual requirements.

Figure 9:
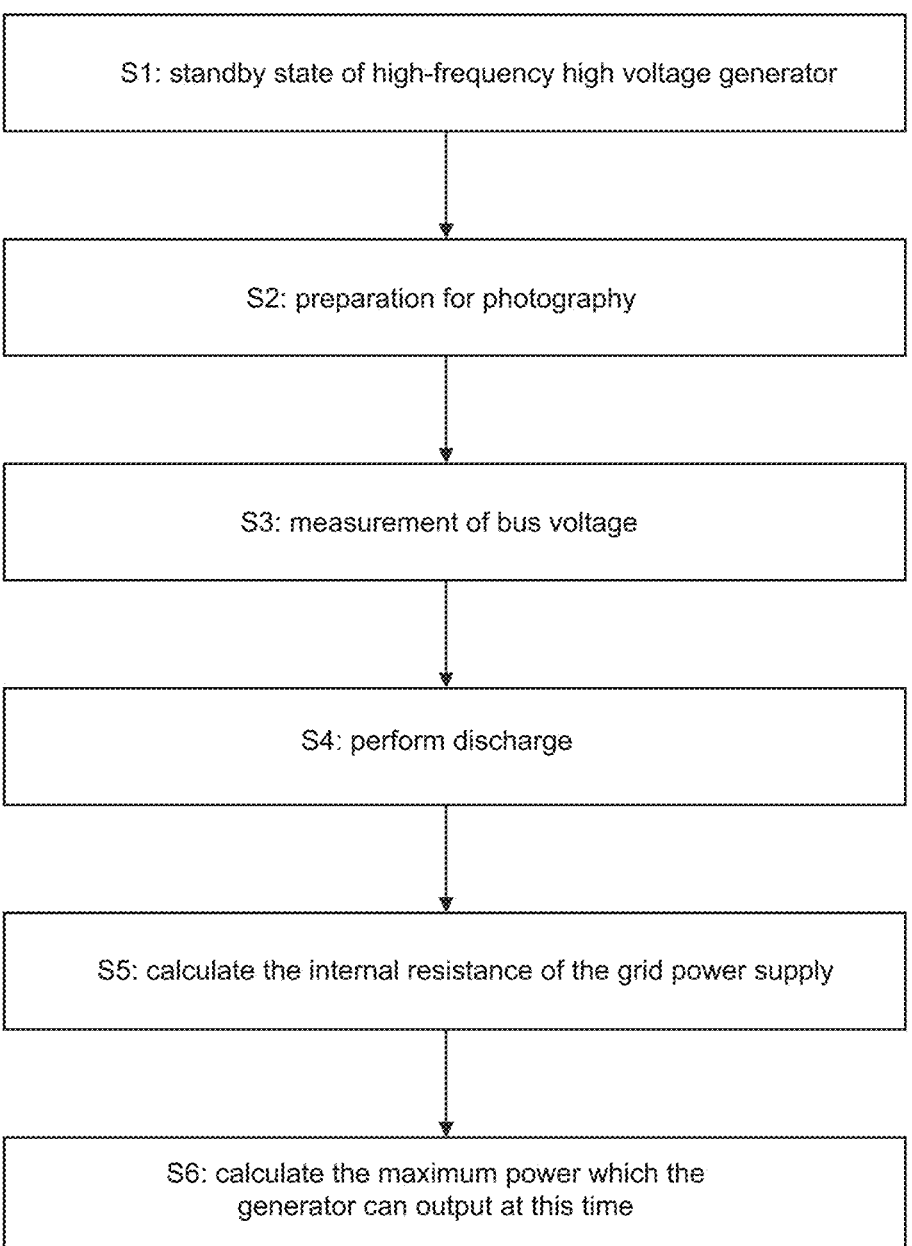
FIG. 9 is a flow chart of measurement of electrical energy capacity of a power grid in an exemplary embodiment of the present disclosure.

In an exemplary embodiment, in particular see FIG. 9, which shows a flow chart of measurement of electrical capacity. This is explained in detail below:

S1: standby state of high-frequency high voltage genera-tor 2;

S2: preparation for photography;

S3: measurement of bus voltage $V_{UDC}$

S4: perform discharge once:

1. the discharge time is one period of the rectified waveform;

2. the voltage across the discharge resistor R is col-lected, and the maximum voltage value $V_R$ is taken;

3. the bus voltage value during discharge is measured, and the maximum voltage value $V'_{max}$ is taken;

S5: Formula 4 is used to calculate the internal resistance of the grid power supply;

S6: Formula 6 is used to calculate the maximum power which the generator can output at this time.

The electrical energy generator in embodiments of the present disclosure, and the automatic measurement appara-tus and measurement method thereof, at least have the following beneficial effects:

(1) In economically undeveloped regions, mountainous regions, remote regions, and regions with poor elec-tricity grids, the generator can be used with active downgrade, ensuring that emergency patients can be diagnosed normally.

(2) The electrical energy generator can measure the inter-nal resistance of the power grid at any time, and can troubleshoot problems in advance, such as power sup-ply line aging, failure of power distribution air switch contacts, and failure of power contactors.

(3) The electrical energy generator is more intelligent, being able to distinguish, before exposure, whether the present exposure will exceed the capacity of the power supply.

Figure 10:
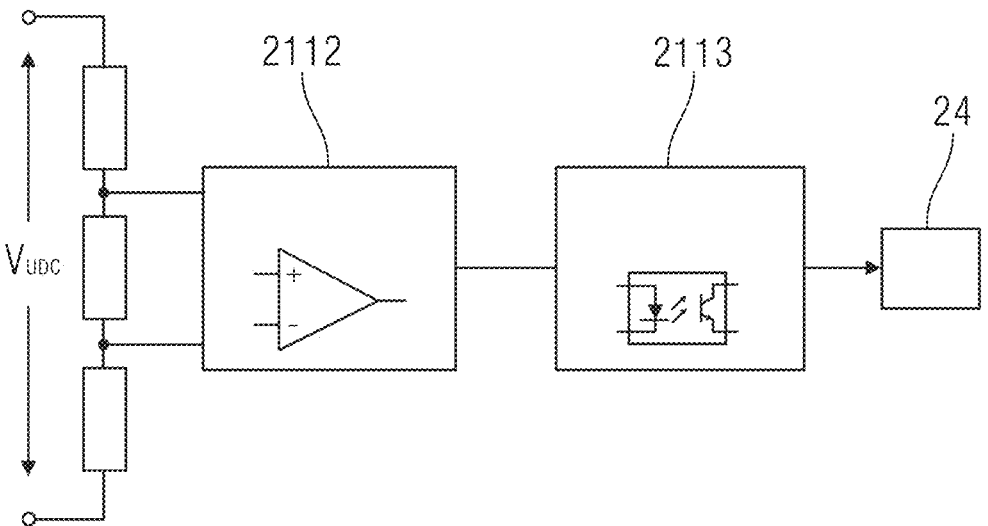
FIG. 10 shows the circuit principle of bus voltage sampling in an exemplary embodiment of the present disclosure.

In an exemplary embodiment, the circuit principle in FIG. 10 may be used to obtain samples of the bus voltage. The basic principle thereof is to acquire a voltage proportionally by resistor voltage division and a voltage sampling circuit 2112; since our generator control circuit 24 is low-voltage, an opto-isolating ADC device 2113 is needed, to resend the sampled voltage in digital form to the generator control circuit 24.

Figure 11:
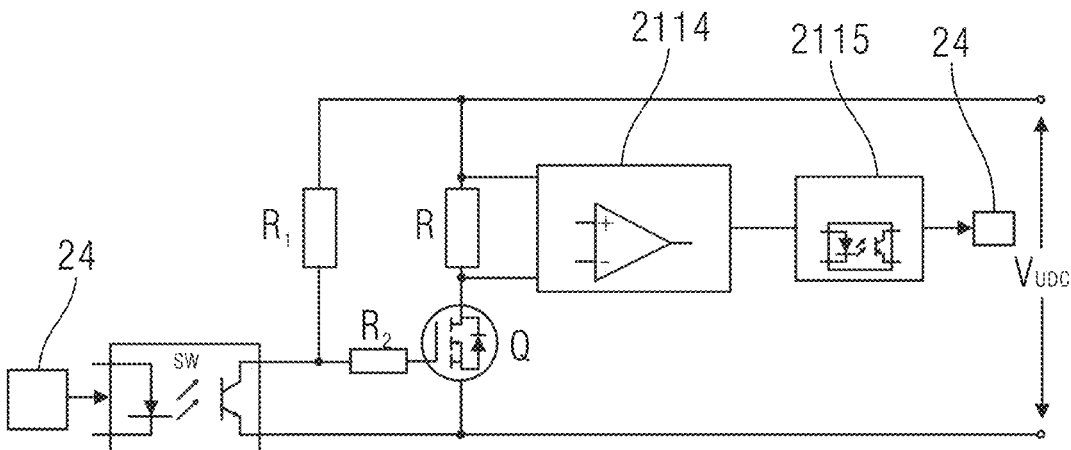
FIG. 11 shows the circuit principle of controlled discharge and discharge current measurement in an exemplary embodiment of the present disclosure.

In an exemplary embodiment, the circuit principle in FIG. 11 may be used to realize controlled discharge and discharge current measurement. The generator control circuit 24 is used to turn on the switch, at which time current does not pass through R2, so Q does not conduct; at this time, discharge is not possible. When the generator control circuit 24 stops supplying power, current will flow through R1 and R2, thus causing Q to conduct, so current will flow through resistor R; at this time, the voltage drop across R can be measured by means of a voltage sampling circuit 2114, and a digital signal is then sent to the generator control circuit 24 by means of an opto-isolating ADC device 2115.

According to another aspect of embodiments of the pres-ent disclosure, a non-transitory computer-readable storage medium storing a computer program is provided, wherein the computer program, when executed by a processor, realizes the automatic measurement method according to any one of the above-described embodiments of the present disclosure.

According to another aspect of embodiments of the pres-ent disclosure, a computer program product is provided, comprising a computer program, wherein the computer program, when executed by a processor, realizes the auto-matic measurement method according to any one of the above-described embodiments of the present disclosure.

Various implementations of the systems and techniques described above herein may be implemented in digital electronic circuit systems, integrated circuit systems, field programmable gate arrays (FPGAs), application specific integrated circuits (ASICs), application specific standard products (ASSPs), system-on-chip systems (SOC), load programmable logic devices (CPLD), computer hardware, firmware, software, and/or combinations thereof. Various implementations may include being implemented in one or more computer programs, which are executable and/or interpreted on a programmable system including at least one programmable processor. The programmable processor may be a special-purpose or general-purpose programmable processor, and may receive and transmit data and instructions from and to a storage system, at least one input apparatus, and at least one output apparatus.

Program codes for implementing the method of the present disclosure may be written in any combination of one or more programming languages. These program codes may be supplied to a processor or controller of a general-purpose computer, a special purpose computer, or other programmable data processing apparatuses, so that the program codes, when executed by the processor or controller, cause the functions/functions specified in the flowcharts and/or block diagrams to be implemented. The program codes may be executed entirely or partly on a machine, or as a stand-alone software package, partly on a machine and partly on a remote machine, or entirely on the remote machine or a server.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

In the context of the present disclosure, the computer-readable storage medium may be a tangible medium that may include or store a program for use by or in conjunction with an instruction execution system, apparatus, or device. The computer-readable storage medium may be a computer-readable signal medium or a computer-readable storage medium. A computer-readable medium may include, but is not limited to, electronic, magnetic, optical, electromagnetic, infrared, or semiconductor systems, apparatus, or devices, or any suitable combination thereof. More specific examples of readable storage media include one or more wire-based electrical connections, portable computer disks, hard disks, random access memories (RAM), read only memories (ROM), erasable programmable read only memories (EPROM) or flash memory), optical fibres, compact disk read-only memories (CD-ROM), optical storage devices, magnetic storage devices, or any suitable combination thereof.

It should be understood that the steps may be re-ordered, added or deleted using various forms of flow shown above. For example, the steps described in the present disclosure may be executed in parallel, sequentially or in a different order, as long as the desired result of the technical solution disclosed in the present disclosure can be achieved, and no limitation is imposed herein.

Although the embodiments or examples of the present disclosure have already been described with reference to the drawings, it should be understood that the above-mentioned methods, systems and devices are merely exemplary embodiments or examples, and the scope of the present disclosure is not limited by these embodiments or examples, instead being defined solely by the granted claims and the equivalent scope thereof. Various key elements in the embodiments or examples may be omitted or may be replaced by equivalent key elements thereof. In addition, the steps may be executed in an order different from that described in the present disclosure. Importantly, as technology evolves, many key elements described here may be replaced by equivalent key elements appearing after the present disclosure.

It should also be noted that the specific technical features described in the above detailed description of the disclosure can be combined in any suitable manner if there is no contradiction. In order to avoid unnecessary repetition, various possible combinations will not be further illustrated in the present disclosure.

REFERENCE LIST 1 three-phase/single-phase grid power supply
2 high-frequency high voltage generator
3 X-ray tube assembly
4 X-rays
5 electrons
6 peripheral component
21 rectifying and filtering circuit
22 high voltage main inversion circuit
23 low voltage control power supply
24 generator control circuit
25 filament heating circuit
26 rotating-anode drive circuit
271 high voltage oil tank
272 high voltage transformer
273 high voltage rectification and filtering
274 large/small focal spot filament transformer
28 peripheral interface circuit
2101 overload protection module
2102 EMC power supply filter
2103 current-limiting contactor
2104 switch-on contactor
2105 full-wave rectification circuit module
2106 filtering circuit module
2107 discharge loop
2108 control for current-limiting contactor and switch-on contactor
2109 DC bus voltage output
2110 power grid electrical energy capacity measurement and discharge module
21101 filtered DC bus voltage input
21102 bus voltage measurement circuit
21103 discharge loop
21104 discharge current measurement circuit
2112 voltage sampling circuit
2113 opto-isolating ADC device
2114 voltage sampling circuit
2115 opto-isolating ADC device

The invention claimed is:

1. An electrical energy generator, having an input end connected to alternating current (AC) power of a power grid, and an output end connected to an electrical component, wherein the electrical energy generator comprises:

a rectifying and filtering circuit configured to rectify and filter AC power of the power grid; and an automatic measurement circuit including:

a bus voltage measurement circuit configured to acquire a bus voltage value outputted by the rectifying and filtering circuit;

a discharge loop, having a switch and a discharge resistor connected in series, the discharge resistor discharging electrical energy generated by the electrical energy generator;

a control circuit configured to control opening and closing of the switch, wherein, before the electrical energy generator supplies power to the electrical component, the control circuit is configured to control the switch to close for a first duration to perform discharging through the discharge resistor; and a discharge current measurement circuit configured to acquire a discharge resistor current value of a discharge process of the first duration, the first duration being greater than or equal to one period of a rectified waveform.

2. The electrical energy generator as claimed in claim 1, wherein, after the electrical energy generator has supplied power to the electrical component, the control circuit is configured to control the switch to close for a second duration, to perform discharging through the discharge resistor.

3. The electrical energy generator as claimed in claim 1, wherein the discharge current measurement circuit is configured to measure a voltage across the discharge resistor.

4. An electrical energy generator, having an input end connected to alternating current (AC) power of a power grid, and an output end connected to an electrical component, the electrical energy generator comprising:

a rectifying and filtering circuit configured to rectify and filter AC power of the power grid;

an automatic measurement circuit including:

a discharge loop, having a switch and a discharge resistor connected in series, the discharge resistor discharging electrical energy generated by the electrical energy generator;

a control circuit configured to control opening and closing of the switch, wherein, before the electrical energy generator supplies power to the electrical component, the control circuit is configured to control the switch to close for a first duration to perform discharging through the discharge resistor;

a bus voltage measurement circuit configured to acquire a bus voltage value outputted by the rectifying and filtering circuit; and a discharge current measurement circuit configured to acquire a discharge resistor current value of a discharge process of the first duration, wherein the first duration is greater than or equal to one period of a rectified waveform, and wherein the discharge current measurement circuit is configured to measure a voltage across the discharge resistor; and a calculator configured to calculate an internal resistance of the power grid based on the bus voltage and the voltage across the discharge resistor.

5. The electrical energy generator as claimed in claim 4, wherein:

before power is supplied to the electrical component, the control circuit is configured to control the switch of the discharge loop to open, and the calculator is configured to read a first voltage of the bus; and the control circuit is configured to control the switch of the discharge loop to close, and the calculator is configured to: read a second voltage of the bus and a third voltage across the discharge resistor, and calculate the internal resistance of the power grid based on at least the first voltage, the second voltage, the third voltage, and the resistance of the discharge resistor.

6. The electrical energy generator as claimed in claim 4, wherein the electrical component is an X-ray tube assembly, and the electrical energy generator further comprises: a filament heating circuit.

7. The electrical energy generator as claimed in claim 4, wherein the calculator is further configured to calculate a maximum electrical power of the electrical component based on the internal resistance of the power grid.

8. The electrical energy generator as claimed in claim 7, wherein the calculation of a maximum electrical power of the electrical component comprises:

calculating a maximum output current based on a power supply lower deviation tolerance value and the internal resistance of the power grid; and calculating a maximum electrical power of the electrical component based on the maximum output current and a nominal supply voltage of the electrical component.

* * * * *